United States Patent
Jean et al.

(10) Patent No.: US 11,587,613 B2
(45) Date of Patent: Feb. 21, 2023

(54) REFLOW PROTECTION

(71) Applicant: Micron Technology, Inc., Boise, ID (US)

(72) Inventors: Sebastien Andre Jean, Meridian, ID (US); Ting Luo, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/572,209

(22) Filed: Jan. 10, 2022

(65) Prior Publication Data

US 2022/0130457 A1 Apr. 28, 2022

Related U.S. Application Data

(63) Continuation of application No. 16/915,537, filed on Jun. 29, 2020, now Pat. No. 11,222,692, which is a continuation of application No. 16/209,152, filed on Dec. 4, 2018, now Pat. No. 10,699,780, which is a continuation of application No. 15/689,989, filed on Aug. 29, 2017, now Pat. No. 10,347,329.

(51) Int. Cl.
| | |
|---|---|
| G11C 16/22 | (2006.01) |
| G11C 11/56 | (2006.01) |
| G11C 16/34 | (2006.01) |
| G11C 16/10 | (2006.01) |

(52) U.S. Cl.
CPC .......... *G11C 11/5628* (2013.01); *G11C 16/10* (2013.01); *G11C 16/3418* (2013.01); *G11C 16/3459* (2013.01); *G11C 2211/5641* (2013.01)

(58) Field of Classification Search
CPC . G11C 11/5628; G11C 16/10; G11C 16/3418; G11C 16/3459; G11C 2211/5641; G11C 16/22; G11C 16/0483; G11C 16/3404
See application file for complete search history.

(56) References Cited

U.S. PATENT DOCUMENTS

| | | |
|---|---|---|
| 8,886,911 B2 | 11/2014 | Nemazie et al. |
| 9,036,396 B2 | 5/2015 | Heller et al. |
| 9,229,806 B2 | 1/2016 | Mekhanik et al. |
| 9,406,392 B2 | 8/2016 | Kyung et al. |
| 9,704,595 B1 | 7/2017 | Eyal et al. |

(Continued)

FOREIGN PATENT DOCUMENTS

| | | |
|---|---|---|
| CN | 111164697 A | 5/2020 |
| KR | 20150118650 A | 10/2015 |

(Continued)

OTHER PUBLICATIONS

US 10,163,498 B1, 12/2018, Jean et al. (withdrawn)

(Continued)

*Primary Examiner* — Khamdan N. Alrobaie
(74) *Attorney, Agent, or Firm* — Schwegman Lundberg & Woessner, P.A.

(57) ABSTRACT

Devices and techniques to reduce corruption of received data during assembly are disclosed herein. A memory device can perform operations to store received data, including preloaded data, in a first mode until the received data exceeds a threshold amount, and to transition from the first mode to a second mode after the received data exceeds the threshold amount.

20 Claims, 8 Drawing Sheets

(56) References Cited

U.S. PATENT DOCUMENTS

| | | |
|---|---|---|
| 10,347,329 B2 | 7/2019 | Jean et al. |
| 10,699,780 B2 | 6/2020 | Jean |
| 11,222,692 B2 | 1/2022 | Jean et al. |
| 2009/0091996 A1 | 4/2009 | Chen et al. |
| 2010/0122016 A1 | 5/2010 | Marotta et al. |
| 2010/0169547 A1 | 7/2010 | Ou |
| 2012/0155167 A1 | 6/2012 | Uehara |
| 2013/0308390 A1 | 11/2013 | Lee |
| 2014/0063900 A1 | 3/2014 | Heller et al. |
| 2015/0120988 A1 | 4/2015 | Hung et al. |
| 2015/0135023 A1 | 5/2015 | Mekhanik et al. |
| 2015/0178188 A1 | 6/2015 | Grin et al. |
| 2015/0294723 A1 | 10/2015 | Choi et al. |
| 2016/0099078 A1 | 4/2016 | Luo et al. |
| 2018/0039537 A1* | 2/2018 | Chih .............. G06F 11/1068 |
| 2019/0066775 A1 | 2/2019 | Jean et al. |
| 2019/0108878 A1 | 4/2019 | Jean et al. |
| 2020/0327934 A1 | 10/2020 | Jean et al. |

FOREIGN PATENT DOCUMENTS

| | | |
|---|---|---|
| KR | 102309501 | 10/2021 |
| KR | 102410930 | 6/2022 |
| WO | WO-2019046044 A1 | 3/2019 |

OTHER PUBLICATIONS

"Korean Application Serial No. 10-2021-7031367, Response filed Jan. 28, 2022 to Notice of Preliminary Rejection dated Dec. 3, 2021", w English Claims, 17 pgs.

"Korean Application Serial No. 10-2021-7031367, Notice of Preliminary Rejection dated Dec. 3, 2021", w English translation, 5 pgs.

"International Application Serial No. PCT/US2018/047287, International Preliminary Report on Patentability dated Mar. 12, 2020", 9 pgs.

"International Application Serial No. PCT/US2018/047287, International Search Report dated Dec. 13, 2018", 3 pgs.

"International Application Serial No. PCT/US2018/047287, Written Opinion dated Dec. 13, 2018", 7 pgs.

"JEDEC Standard", Universal Flash Storage UFS Version 2.1 JESD220C, (Mar. 2016), 382 pgs.

"Korean Application Serial No. 10-2020-7008809, Notice of Preliminary Rejection dated Jan. 27, 2021", w/ English translation, 4 pgs.

"Korean Application Serial No. 10-2020-7008809, Response filed Mar. 18, 2021 to Notice of Preliminary Rejection dated Jan. 27, 2021", w/ English Claims, 9 pgs.

* cited by examiner

REFLOW PROTECTION

PRIORITY APPLICATION

This application is a continuation of U.S. application Ser. No. 16/915,537, filed Jun. 29, 2020, which is a continuation of U.S. application Ser. No. 16/209,152, filed Dec. 4, 2018, now issued as U.S. Pat. No. 10,699,780, which is a continuation of U.S. application Ser. No. 15/689,989, filed Aug. 29, 2017, now issued as U.S. Pat. No. 10,347,329, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Each memory cell in a memory array can be programmed individually or collectively to one or a number of programmed states. For example, a single-level cell (SLC) can represent one of two programmed states (e.g., 1 or 0), representing one bit of data. In other examples, memory cells can represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Memory cells may be subject to high temperatures during assembly of a memory device, assembly of an electronic device or printed circuit board (PCB) including the memory device, or other production process associated with the memory cells. For example, the memory device can be attached to a PCB using an infrared (IR) reflow operation, having temperatures that may exceed 240° C. Exposing memory cells to high temperatures can change the threshold voltage of the memory cells, causing errors in stored data. SLC memory cells typically have greater threshold temperature margins than MLC memory cells (e.g., MLC, TLC, QLC memory cells, etc.). Accordingly, data preloaded onto memory cells prior to some application of high temperature, such as firmware loaded onto a memory device prior to assembly, can be stored on the memory cells as SLC data.

Certain memory devices have separate SLC and MLC portions, such as disclosed in Mekhanik et al. U.S. Pat. No. 9,229,806 (herein the '806 patent), assigned to SanDisk Technologies LLC. The '806 patent detects an error rate in the memory device. When the error rate is greater than a threshold, the IR reflow process is assumed complete, and preloaded data can be moved from the SLC portion of the memory device to an MLC portion of the memory device. However, such method requires detection of error rates in memory and comparison to a threshold while the error rate is below such threshold, as well as required, separate SLC and MLC portions of memory.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
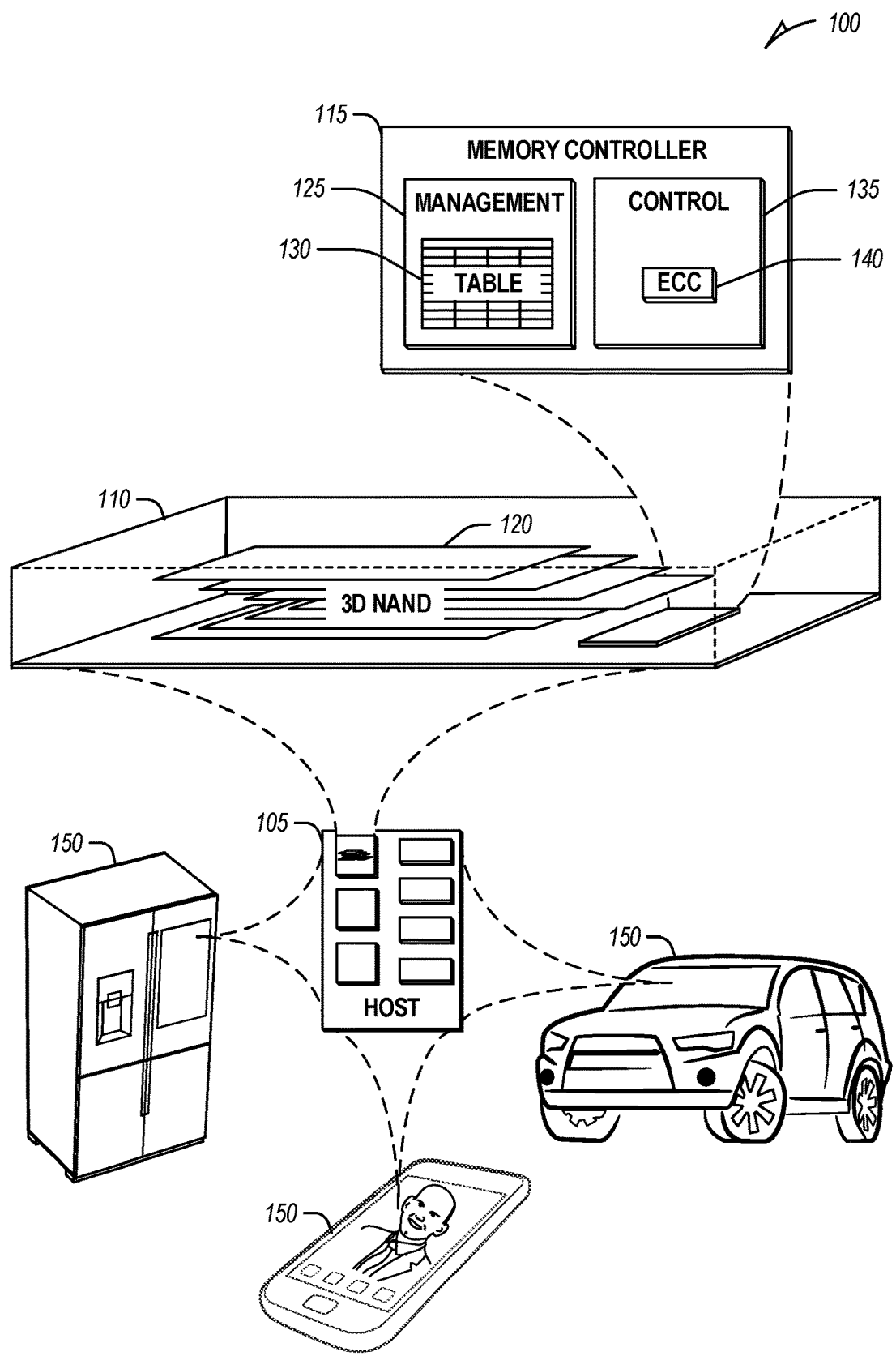
FIG. 1 illustrates an example of an environment including a memory device.

The present inventors have recognized, among other things, robust protection of temperature-vulnerable data on memory cells during assembly or manufacture, in certain examples, without calculation of error rates, without a comparison of calculated error rates to a threshold, without required, separate, physical SLC and MLC portions of memory, without receiving an indication of the size or amount of temperature-vulnerable data prior to assembly or manufacture, without receiving a separate indication that assembly or manufacture has occurred or completed, or without receiving a separate verification of preloaded data.

During manufacture or assembly, electronic parts are subject to high temperatures, such as during molding or curing of materials, attachment or mounting of one or more components to a board or another component, soldering, etc. For example, a memory device can include a number of dies or logical units, as well as one or more memory controllers, processors, or other logical units and interfaces. In certain examples, the respective dies and memory controllers are manufactured separately, then assembled into the memory device. Assembly of the memory device can include a number of processes involving heat. Further, the memory device can be attached or included as a component of an electronic device.

In an example, the memory device can be attached to a board or other contact of the electronic device (or other component) using heat, such as reflow soldering (e.g., infrared (IR) reflow soldering). During reflow soldering of a memory device, a solder paste can be applied to areas (e.g., contacts) of the memory device requiring soldering (and not to areas not requiring soldering, such as using selective application of solder paste, or solder resist or a solder mask, etc.). Once the solder paste is applied, the memory device can be placed in position for attachment, and heated. The reflow process may include a number of steps carefully controlled to avoid thermal damage to the memory device, board, or other components. An example reflow process includes: preheating; thermal soak; reflow (e.g., causing the solder pate to melt and create solder joints); and cooling. In certain examples, a single memory device may be subject to heating multiple times, either as redundant process steps to ensure connection, or as other components are attached to the memory device, board, or other component associated with the memory device.

However, even if the physical components or packaging of the memory device are not damaged during reflow soldering, data stored on the memory device can be shifted (e.g., can leak) or become corrupted during heating. Whereas erase/program cycles may cause distribution errors to flatten and widen, in certain examples, IR reflow may cause voltage distribution of stored data to narrow (e.g., leak, shift left, etc.) from existing threshold voltages. Smaller gaps between threshold voltages (e.g., such as found in multi-level cells (MLC) in contrast to single-level cells (SLC)) are more susceptible to heat-related read errors and data corruption.

Accordingly, data stored on a memory array prior to manufacture or assembly of a memory device including the memory array, or an electronic device including the memory device, may be subject to heat-related corruption. In certain examples, memory cells in a memory array (e.g., a NAND memory array, a three-dimensional (3D) NAND memory array, etc.) can be operated as single-level cells (SLC) or multi-level cells (MLC) (including two-level cells, triple-level cells (TLC), quad-level cells (QLC), etc.). In other examples, memory arrays can include a combination of SLC and MLC, or can include different portions of a memory array (e.g., blocks, pages, die, etc.) dedicated as SLC or MLC. However, such combinations, in certain examples, may fail to fully utilize the storage capabilities (e.g., capacity) of the memory array for given stored information or use conditions or scenarios.

In one example, data can be stored on the memory array in a single-level or reflow-protection mode (e.g., as SLC), until a host device provides an indication (e.g., a flag, an instruction, etc.) to the memory device that reflow soldering, heating, or assembly of an electronic device including the host device including a memory device including the memory array is complete, and to transition operation of the memory device from the single-level or reflow-protection mode to a normal-operation or multi-level mode (e.g., as MLC, TLC, QLC, a "normal" mode, etc.), such as to more fully utilize the storage capability of the memory array. For example, the UFS 2.1 standard provides for Production State Awareness, where a first host device (e.g., a device configured to program one or more memory arrays with information, such as preloaded data for an electronic device) loads and verifies that preloaded data has been written to the memory array prior to reflow, assembly, or manufacture of a second host device. After verification, the host device notifies the memory device that loading is complete, where the memory device is expected to undergo reflow or assembly, and then transition to normal operation at the next write. However, if any data is written after the host notifies that loading is complete, the drive can transition prior to reflow or assembly, and data can be corrupted. Further, some manufacturers or users refuse to provide an indication to the memory device that preloaded data has been written, or that assembly is complete, or desire separate or redundant systems or methods.

Accordingly, the present inventors have recognized that certain conditions can be assumed for given use conditions, or information (e.g., preloaded data) can be received prior to assembly that can be used to fully utilize the storage capacity of the memory array, while protecting data stored during assembly, without receiving a separate indication of completed assembly. In certain examples, it can be assumed that the memory device will undergo a certain number of power cycles prior to final assembly, and the memory device can transition from the reflow-protection mode to the normal-operation mode after a number of power cycles (e.g., 3, 4, 5, or more or less, depending on the manufacturer, memory device, electronic device, typical use situations, etc.). In other examples, the threshold amount can include a ratio (e.g., a ration of MLC to SLC of 3:1, etc.), or one or more other pre-set amounts. In certain examples, the MLC portion of the memory array can remain MLC, and the SLC portion of the memory array can remain SLC. Such configuration may reduce the capabilities of the memory array, but may be more robust in operation. If an instruction to write received data in the reflow-protection mode would exceed the capacity of the SLC portion of the memory array, and error message can be returned, and the host device can provide the instruction in normal-operation mode.

In other examples, a host device configured to provide preloaded data (e.g., a kernel, pre-loaded software or instructions, etc.) to the memory device prior to assembly can be different than the electronic device configured to include the memory device after assembly. In certain examples, the memory device can transition from the reflow-protection mode to the normal-operation mode after receiving data from a device different than the host device that provided the preloaded data. In an example, if a command descriptor block includes a host address, the memory device can transition between modes using a detected host address change.

In an example, the amount of preloaded data can be received (e.g., from a manufacturer, user, etc.) or assumed, and a threshold amount can be set above that amount (e.g., 3 GB, 5 GB, 7 GB, etc.), or can otherwise be configurable, manually or automatically, for example, based on the type of memory device, the type of preloaded data, a descriptor in the preloaded data, or an indication of the electronic device configured to include the memory device. Data can be stored in the memory device below the threshold amount in the reflow-protection mode (e.g., as SLC). Once the threshold amount has been exceeded, the memory device can transition from the reflow-protection mode to the normal-operation mode, where data can be stored in the memory device in a multi-level mode (e.g., as MLC). In an example, the memory device can transition upon receiving an instruction that would write data to the memory array that would exceed the threshold amount. In other examples, if an instruction to write data would result in the stored data exceeding the threshold amount, the memory controller can provide a return error, then transition. In other examples, the memory controller can be configured to store the received data in the reflow-protection mode, then test to see if the threshold amount has been exceeded following execution of an instruction.

In other examples, the threshold amount can include received or assumed number of logical block addressing (LBA) addresses. For example, data can be stored on the memory device in the reflow-protection mode using an initial number of LBA addresses. When the memory device receives an instruction to write data to an LBA address different than (or different from) the initial number (or initial set) of LBA, the memory device can transition to the normal-operation mode. In other examples, one or more other triggers or transitions can be used, such as a specific command, or an action outside of normal operation, such as holding reset for a period of time (e.g., 5 seconds, etc.).

In an example, instead of sending an instruction or flag to the memory device to transition from the single-level mode to the multi-level mode, the host device can write a dummy file to exceed the threshold amount or dummy file larger than the threshold amount (which can later be cleaned during background operations in the normal-operation mode). In other examples, if the threshold amount is a number of power cycles, LBA address, or one or more other threshold amounts, the electronic device can, once assembly is complete, perform an operation to exceed the threshold amount, or the electronic device can remain in the single-level mode after assembly until the threshold amount is exceeded, without significantly affecting the life or user-experience of the electronic device.

In an example, if the memory device includes a number of memory dies (e.g., more than two), the memory controller can be configured to store the preloaded data on a subset of the number of memory dies (e.g., 1 of 8 memory dies, 2 of 8 memory dies, etc.) in the reflow-protection mode on the subset of memory dies as SLC. When the received data can no longer be contained on the subset of memory dies, the memory controller can transition to normal-operation, including storing received data on the number of memory dies, or the remaining memory dies, as MLC.

In certain examples, data stored on the memory array in the reflow-protection mode (e.g., preloaded data, etc.) as SLC can be relocated to the memory array in the normal-operation mode as MLC. In an example, once the memory device transitions from the reflow-protection mode to the normal-operation mode, the memory cells used to store the data in the reflow-protection mode can be reallocated from SLC to MLC (e.g., two-level cells, TLC, QLC, etc.), such as to fully utilize drive capacity. In other examples, the memory array can be configured as other combinations of SLC and MLC, depending on the electronic device, use conditions, etc.

In an example, the memory controller can be configured to suspend normal media management during the reflow-protection mode. For example, background operations, such as, for example, data migration, wear leveling, garbage collection, bad block management, or other error correction or data management operations, may be suspended until normal-operation resumes. In an example, once the threshold amount of data has been received, and the memory controller transitions from the reflow-protection mode to the normal-operation mode, background operations can be re-enabled, and the memory controller can manage data previously stored on the drive, in case of errors or corruptions, as if data in the memory array has undergone one or more reflow processes (e.g., 3× reflow, etc.).

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 500 of FIG. 5.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
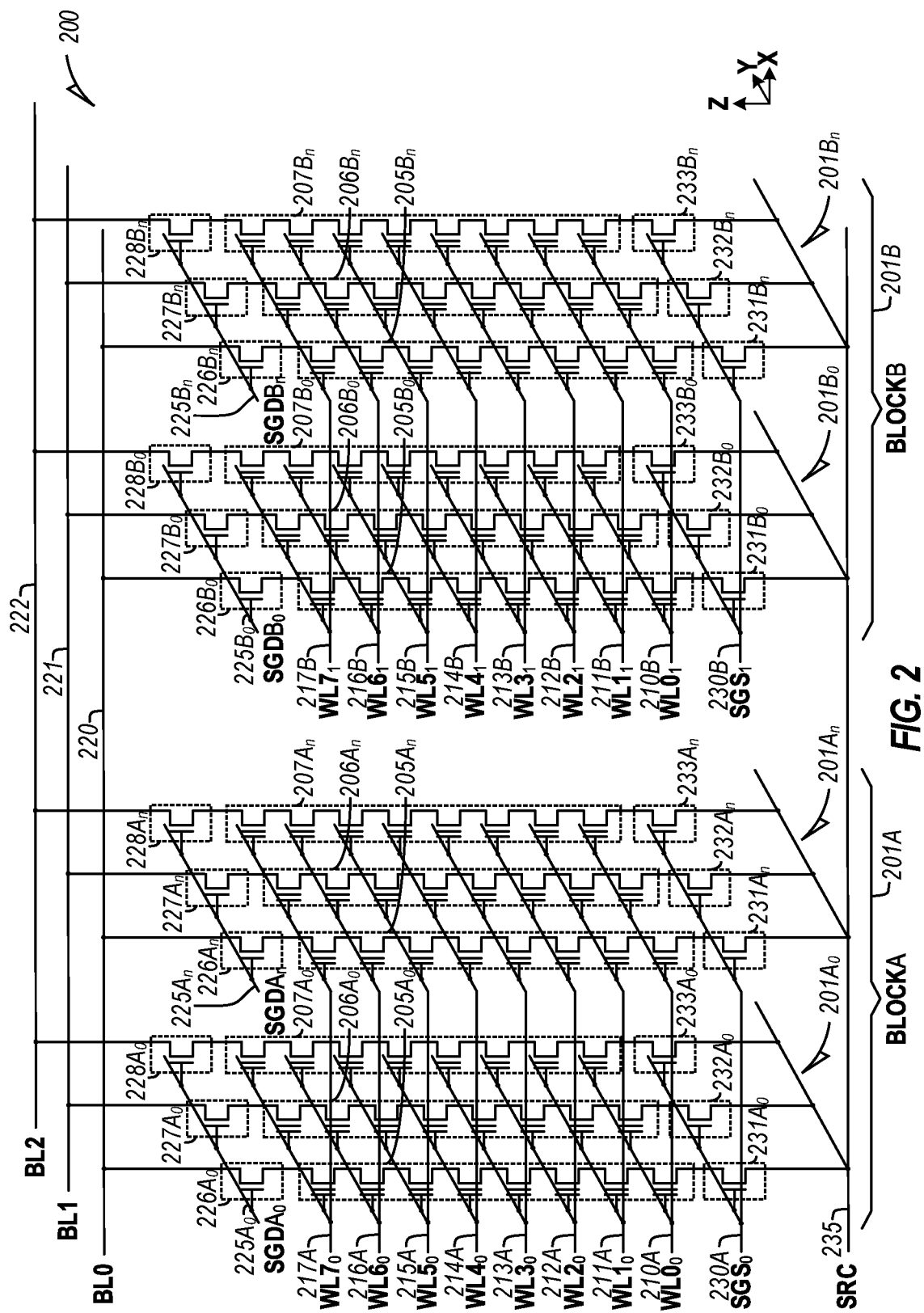
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
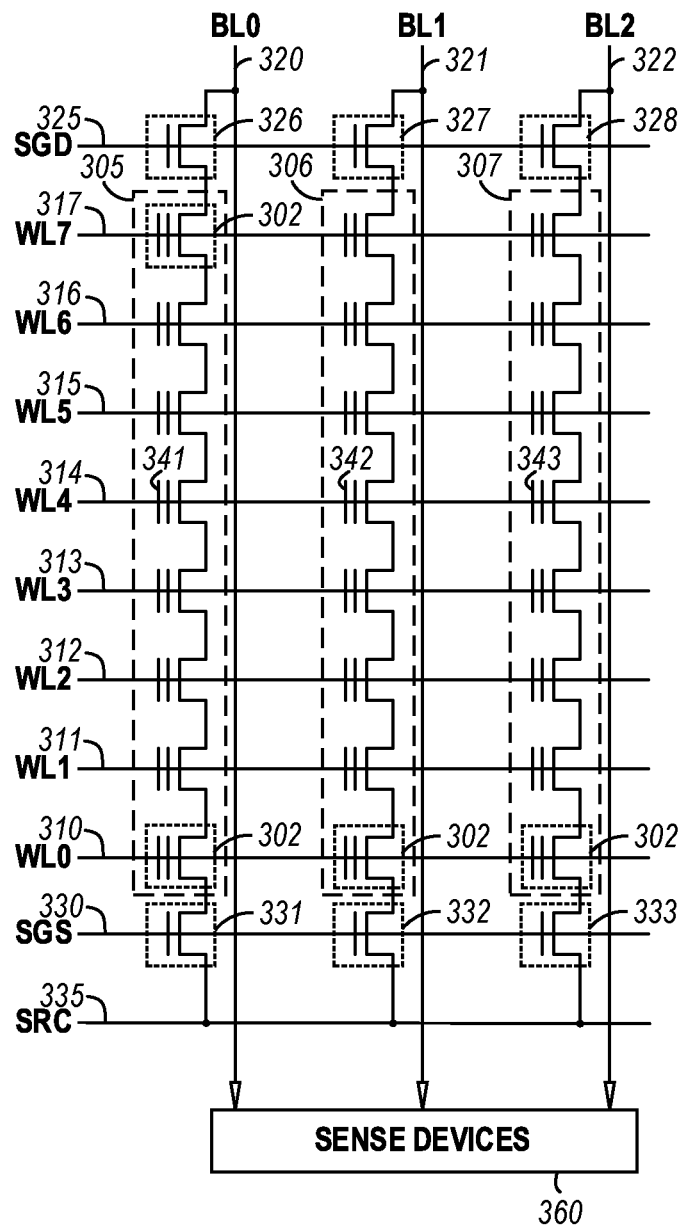

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10 V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
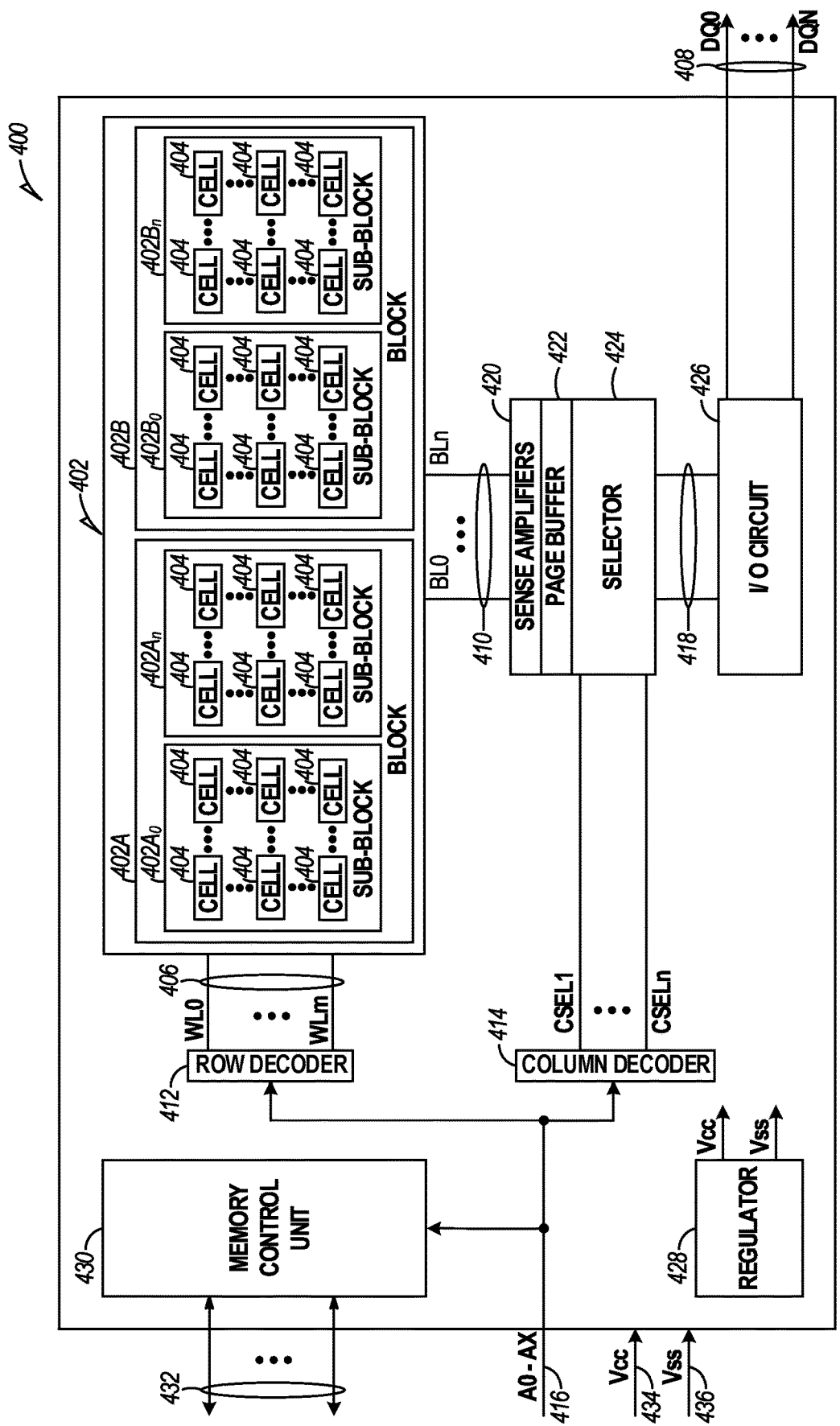
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5A:
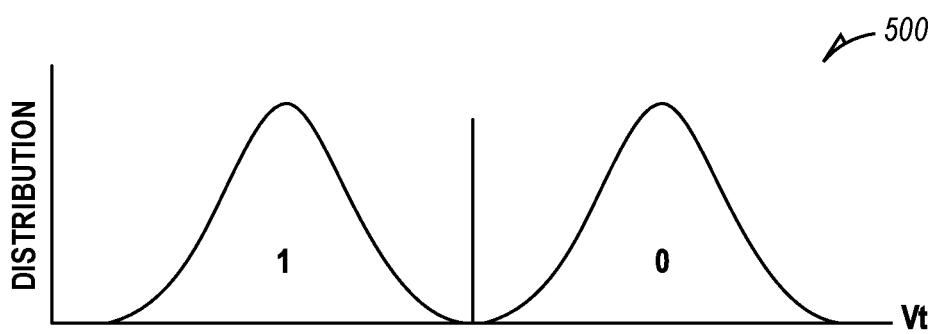
FIGS. 5A-5B illustrate example charge distributions for single-level and multi-level cells.
Figure 5B:
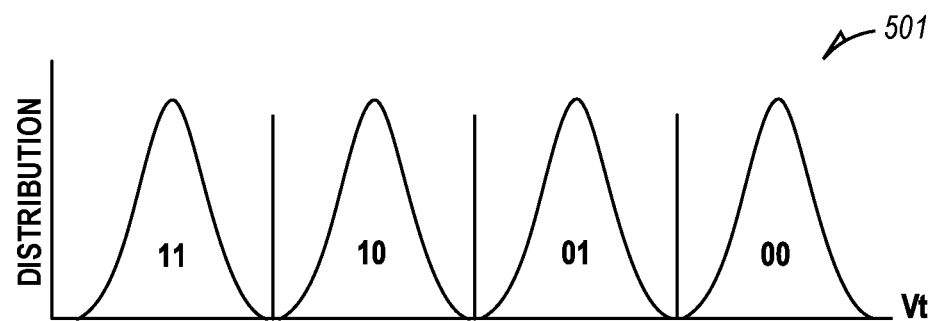

FIGS. 5A-5B illustrate example charge distributions, including an example single-level cells (SLC) charge distribution 500 and an example multi-level cells (MLC) charge distribution 501. In FIG. 5A, the SLC charge distribution 500 illustrates two available states ("1" and "0") separated by a reference point. The value of the reference point and scale of the threshold voltage (Vt) of a cell depends on, among other things, the logic level of the memory device. In FIG. 5B, the MLC charge distribution 501 (in this example, two-level cells) illustrates four possible states ("11", "10", "01", and "00") separated by multiple reference points. The margin between the voltage distributions and reference points are narrower in MLC than SLC, and more susceptible to corruption from cell leakage and voltage shift when exposed to high temperatures (e.g., greater than 180° C., greater than 200° C., greater than 220° C., etc.).

Figure 6:
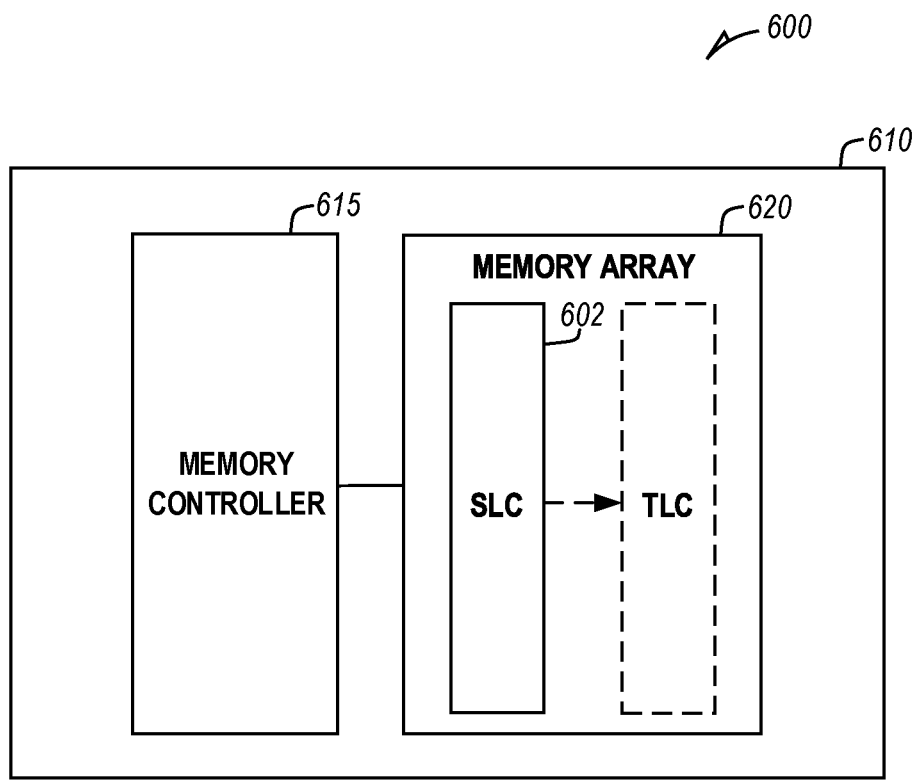
FIG. 6 illustrates an example block diagram of a memory device.

FIG. 6 illustrates an example block diagram of an electronic device 600 including a memory device 610, the memory device 610 including a memory controller 615 and a memory array 620. The memory array 620 can be operated in a number of modes, including, for example, a reflow-protection mode (e.g., a single-level mode), and a normal-operation mode (e.g., a multi-level mode). In the reflow-protection mode, the memory array 620 can include a number of blocks, including an SLC block 602. In an example, when a threshold is reached, such as a threshold amount of data stored on or written to the memory array 620, a number of power cycles for the memory device 610, a number of LBA addresses used or written by the memory device 610, or one or more other thresholds or threshold conditions, the memory device 610 can transition the memory array 620 from the reflow-protection mode (e.g., as single-level memory cells (SLC)) to the normal-operation mode (e.g., as multi-level cells, such as two-level cells, three-level cells (TLC), four-level cells (QLC), etc.). In an example, the SLC block 602 can be transitioned to an MLC block, such as a TLC block, etc.

Figure 7:
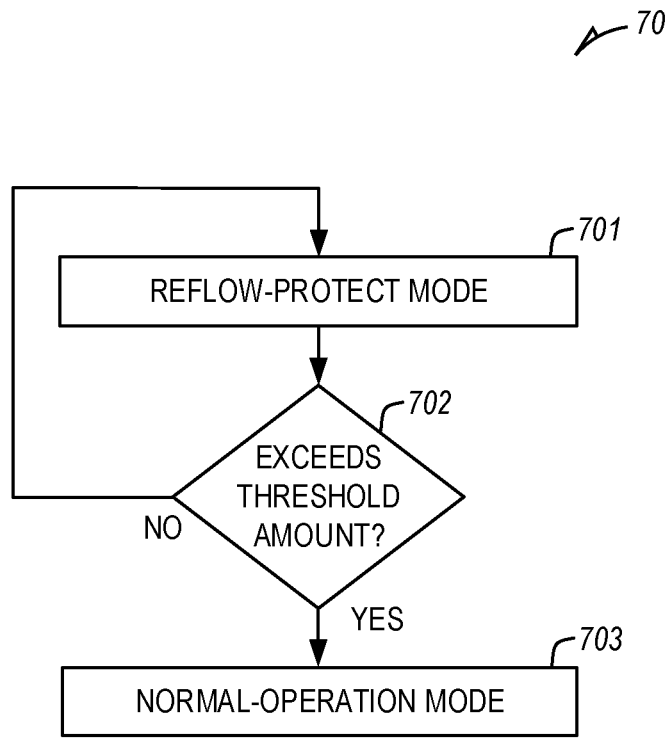
FIG. 7 illustrates an example method for managing a memory device.

FIG. 7 illustrates an example method 700 for managing a memory device. At 701, data, including preloaded data, can be stored on or written to a memory array in a reflow-protection mode as SLC. At 702, the amount of data written to, being written to, stored on the memory array, or instructed to be stored on the memory array in the reflow-protection mode can be compared to a threshold amount. In an example, the memory controller can receive information from a host device, and can establish the threshold amount using the received information, e.g., prior to receiving preloaded data. In other examples, the threshold amount can be set in the memory controller without reference to the host device. In an example, comparison of the threshold amount can decide operation flow without receiving a separate verification of preloaded data, such as from the host device or a device providing the preloaded data to the memory device, or without receiving a separate indication of completed reflow or assembly. In an example, comparison of the data, including preloaded data, stored on the memory device to the threshold amount, alone, can control.

If, at 702, the data written to, being written to, stored on the memory array, or instructed to be stored on the memory array in the reflow-protection mode does not or has not exceeded a threshold amount, data can continue to be stored on or written to the memory array as SLC at 701. If, at 702, the data written to, being written to, stored on the memory array, or instructed to be stored on the memory array in the reflow-protection mode exceeds the threshold amount, the memory array can transition from the reflow-protection mode to a normal-operation mode at 703, and can optionally relocate, rewrite, or re-store the data stored in the reflow-protection mode to the same or another location on the memory array as MLC (e.g., two-level cells, TLC, QLC, etc.), or in a normal-operation (e.g., a multi-level or second mode), optionally after a power-on (e.g., restart, power-on reset, etc.) after the threshold amount is exceeded. Subsequent data, at or above the threshold amount, can be stored on or written to the memory array as MLC, such as after data written to, being written to, stored on the memory array, or instructed to be stored on the memory array exceeds the threshold amount at 702, and optionally, after a power-on after the threshold amount is exceeded.

In other examples, instead of the reflow-protection mode and the normal-operation mode (e.g., two-level mode, three-level mode, four level mode, etc.), the modes can include a first, lower-level mode and a second, higher-level mode. In an example, the first mode can include a two-level mode (e.g., two-level cells) and the second mode can include a three-level mode (e.g., TLC), a four-level mode (e.g., QLC), etc. In an example, the first mode can include a three-level mode and the second mode can include a four-level mode (or higher).

Figure 8:
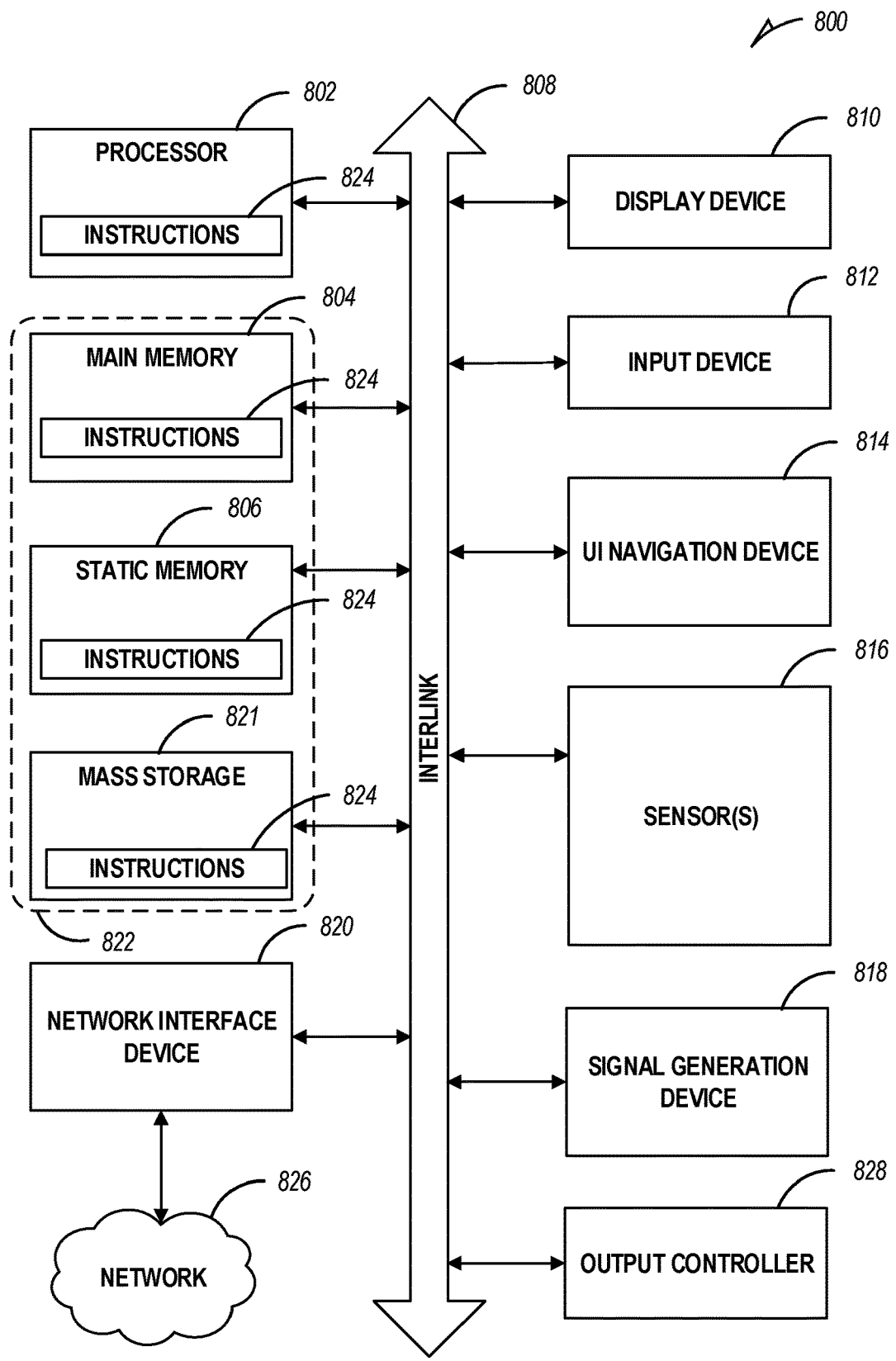
FIG. 8 is a block diagram illustrating an example of a machine upon which one or more embodiments may be implemented.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) may include a hardware processor 802 (e.g., a central processing unit (CPU), a graphics processing unit (GPU), a hardware processor core, or any combination thereof, such as the memory controller 115, etc.), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 816, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute the machine readable medium 822.

While the machine readable medium 822 is illustrated as a single medium, the term "machine readable medium" may include a single medium or multiple media (e.g., a centralized or distributed database, or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

Example 1 is a memory device configured to reduce corruption of preloaded data during assembly, the memory device comprising: a memory array having groups of multiple blocks of memory cells; and a memory controller operably coupled to the memory array, the memory controller to perform operations comprising: store received data, including preloaded data, up to a threshold amount on the memory array in a reflow-protection mode; and transition from the reflow-protection mode to a normal-operation mode after the received data exceeds the threshold amount.

In Example 2, the subject matter of Example 1 optionally includes wherein the memory controller is configured to write the received data in the reflow-protection mode on the memory array as single-level cells (SLC), and to write received data in the normal-operation mode as multi-level cells (MLC).

In Example 3, the subject matter of Example 2 optionally includes wherein, after the received data exceeds the threshold amount, the memory controller is configured to write the received data stored in the reflow-protection mode as SLC to the memory array as MLC.

In Example 4, the subject matter of any one or more of Examples 1-3 optionally include wherein the memory controller is configured to perform background operations in the normal-operation mode, and to suspend background operations in the reflow-protection mode, wherein background operations include data migration.

In Example 5, the subject matter of any one or more of Examples 1-4 optionally include wherein the reflow-protection mode has a greater threshold temperature margin than the normal-operation mode, wherein the threshold amount is greater than the amount of preloaded data including a kernel and pre-loaded software for an electronic device configured to include the memory device, and wherein the memory controller is configured to store the preloaded data on the memory array in the reflow-protection mode as SLC to reduce corruption of the preloaded data during assembly of the electronic device including the memory device.

In Example 6, the subject matter of Example 5 optionally includes wherein, because the threshold amount is greater than the amount of preloaded data, the memory device is configured to store received data in the reflow-protection mode for a short time after assembly of the electronic device, then transition after assembly of the electronic device to the normal-operation mode after the received data exceeds the threshold amount, without receiving a separate indication from a host device of completed assembly.

In Example 7, the subject matter of any one or more of Examples 5-6 optionally include D) NAND memory array.

In Example 8, the subject matter of any one or more of Examples 1-7 optionally include wherein the memory controller is configured to receive the threshold amount from a host device prior to receiving the preloaded data.

In Example 9, the subject matter of any one or more of Examples 1-8 optionally include gigabytes (GB) of data.

In Example 10, the subject matter of any one or more of Examples 1-9 optionally include wherein the memory controller is configured to transition from the reflow-protection mode to the normal-operation mode without receiving a separate verification of preloaded data.

In Example 11, the subject matter of any one or more of Examples 1-10 optionally include wherein the memory controller is configured to transition from the reflow-protection mode to the normal-operation mode without receiving a separate indication of completed assembly.

Example 12 is a method for managing a memory device to reduce corruption of preloaded data during assembly, the method comprising a number of operations performed by a memory controller of a memory array, the memory array having groups of multiple blocks of memory cells, the operations comprising: storing received data, including preloaded data, up to a threshold amount on a memory array memory array in a reflow-protection mode; transitioning from the reflow-protection mode to a normal-operation mode after the received data exceeds the threshold amount.

In Example 13, the subject matter of Example 12 optionally includes the operations comprising: writing received data in the reflow-protection mode on the memory array as single-level cells (SLC); and writing received data in the normal-operation mode on the memory array as multi-level cells (MLC), wherein preloaded data includes a kernel and pre-loaded software for an electronic device configured to include the memory device, and wherein writing received data in the reflow-protection mode as SLC includes to reduce corruption of the preloaded data during assembly of the electronic device including the memory device.

In Example 14, the subject matter of Example 13 optionally includes wherein transitioning from the reflow-protection mode to the normal-operation mode includes writing the received data stored in the reflow-protection mode as SLC to the memory array as MLC.

In Example 15, the subject matter of any one or more of Examples 12-14 optionally include the operations comprising: performing background operations on the memory device in the normal-operation mode; and suspending background operations in the reflow-protection mode, wherein background operations include data migration.

In Example 16, the subject matter of any one or more of Examples 12-15 optionally include the operations comprising: receiving the threshold amount from a host device prior to receiving the preloaded data.

In Example 17, the subject matter of any one or more of Examples 12-16 optionally include wherein transitioning from the reflow-protection mode to the normal-operation mode includes without receiving a separate verification of preloaded data, or without receiving a separate indication of completed assembly.

Example 18 is a device readable storage medium, that provides instructions that, when executed by a memory controller of a memory device, cause the memory controller to perform operations to reduce corruption of preloaded data during assembly, the operations comprising: store received data, including preloaded data, up to a threshold amount on a memory array memory array in a reflow-protection mode; transition from the reflow-protection mode to a normal-operation mode after the received data exceeds the threshold amount.

In Example 19, the subject matter of Example 18 optionally includes the operations comprising: write received data in the reflow-protection mode on the memory array as single-level cells (SLC) to reduce corruption of the preloaded data during assembly of an electronic device including the memory device, wherein the preloaded data includes a kernel and pre-loaded software for the electronic device; and write received data in the normal-operation mode on the memory array as multi-level cells (MLC).

In Example 20, the subject matter of any one or more of Examples 18-19 optionally include wherein the operation to transition from the reflow-protection mode to the normal-operation mode includes to write the received data stored in the reflow-protection mode as SLC to the memory array as MLC.

In Example 21, the subject matter of any one or more of Examples 18-20 optionally include the operations comprising: perform background operations on the memory device in the normal-operation mode; and suspend background operations in the reflow-protection mode, wherein background operations include data migration.

In Example 22, the subject matter of any one or more of Examples 18-21 optionally include the operations comprising: receive the threshold amount from a host device prior to receiving the preloaded data.

In Example 23, the subject matter of any one or more of Examples 18-22 optionally include wherein the operation to transition from the reflow-protection mode to the normal-operation mode includes without receiving a separate verification of preloaded data, or without receiving a separate indication of completed assembly.

Example 24 is a device readable storage medium, that provides instructions that, when executed by a controller of a memory device, optimizes voltage read level calibration in the memory device, wherein the instructions cause the controller to perform operations according to any of the techniques of Examples 1-23.

Example 25 is an apparatus comprising respective means for performing any of the methods or techniques of Examples 1-23.

Example 26 is a system, apparatus, or device to perform the operations of any of Examples 1-23.

Example 27 is a tangible machine readable medium embodying instructions to perform or implement the operations of any of Examples 1-23.

Example 28 is a method to perform the operations of any of Examples 1-23.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A host system comprising:
a host device comprising a host processor;
a storage system comprising at least one non-volatile memory device and control circuitry coupled to the at least one non-volatile memory device, wherein the storage system has a reflow-protection mode and a normal-operation mode, wherein the storage system is configured to transition from the reflow-protection mode to the normal-operation mode after received data exceeds a threshold amount,
wherein the host device is configured to write a dummy file larger than the threshold amount to the storage system to transition the storage system from the reflow-protection mode to the normal-operation mode.

2. The host system of claim 1, wherein the storage system is configured to clean the dummy file from the storage system during a background operation in the normal-operation mode, after transition from the reflow-protection mode to the normal-operation mode.

3. The host system of claim 1, wherein the non-volatile memory device is configured to store received data in the reflow-protection mode to reduce corruption of received data during assembly,
wherein the non-volatile memory device comprises a memory array having groups of multiple blocks of memory cells and a memory controller coupled to the memory array, and
wherein the memory controller is configured to perform operations comprising:
store received data, including preloaded data, on the memory array in the reflow-protection mode until the received data exceeds the threshold amount; and
transition from the reflow-protection mode to the normal-operation mode after the received data exceeds the threshold amount.

4. The host system of claim 3, wherein the reflow-protection mode has a first threshold temperature margin,
wherein the normal-operation mode has a second threshold temperature margin, and
wherein the second threshold temperature margin is less than the first threshold temperature margin.

5. The host system of claim 3, wherein the reflow-protection mode has a first memory density,
wherein the normal-operation mode has a second memory density, and
wherein the second memory density is greater than the first memory density.

6. The host system of claim 3, wherein the memory controller is configured to store the received data, including the preloaded data, on the memory array in the reflow-protection mode as single-level cells (SLC) to reduce corruption of the preloaded data during assembly of the storage system or the host system the non-volatile memory device, and to store the received data in the normal-operation mode on the memory array as multi-level cells (MLC).

7. The host system of claim 6, wherein, after the received data exceeds the threshold amount, the memory controller is configured to store the received data stored in the reflow-protection mode as SLC to the memory array as MLC.

8. The host system of claim 3, wherein the host device is configured to provide the threshold amount to the non-volatile memory device prior to sending the preloaded data.

9. The host system of claim 3, wherein the memory controller is configured to transition from the reflow-protection mode to the normal-operation mode without receiving a separate verification of preloaded data.

10. The host system of claim 3, wherein the memory controller is configured to perform background operations in the normal-operation mode, and to suspend background operations in the reflow-protection mode, wherein background operations include data migration,
wherein the memory controller is configured to clean the dummy file from the storage system during a background operation in the normal-operation mode, after transition from the reflow-protection mode to the normal-operation mode.

11. The host system of claim 3, wherein the memory controller is configured to transition from the reflow-protection mode to the normal-operation mode without receiving a separate indication of completed assembly.

12. A method comprising:
writing, using a host device comprises a host processor, a dummy file larger than a threshold amount to a storage system to transition the storage system from a reflow-protection mode to a normal-operation mode, wherein the storage system comprises at least one non-volatile memory device and control circuitry coupled to the at least one non-volatile memory device, and is configured to transition from the reflow-protection mode to the normal-operation mode after received data exceeds a threshold amount.

13. The method of claim 12, comprising:
cleaning, using the storage system, the dummy file from the storage system during a background operation in the normal-operation mode, after transitioning from the reflow-protection mode to the normal-operation mode.

14. The method of claim 12, comprising:
storing, using the storage system, received data, including preloaded data, in the reflow-protection mode until the received data exceeds the threshold amount to reduce corruption of received data during assembly; and
transitioning, using the storage system, from the reflow-protection mode to the normal-operation mode after the received data exceeds the threshold amount,
wherein the non-volatile memory device comprises a memory array having groups of multiple blocks of memory cells and a memory controller coupled to the memory array.

15. The method of claim 14, wherein the reflow-protection mode has a first threshold temperature margin,
wherein the normal-operation mode has a second threshold temperature margin, and
wherein the second threshold temperature margin is less than the first threshold temperature margin.

16. The method of claim 14, wherein the reflow-protection mode has a first memory density,
wherein the normal-operation mode has a second memory density, and
wherein the second memory density is greater than the first memory density.

17. The method of claim 14, wherein storing the received data in the reflow-protection mode comprises storing the received data as single-level cells (SLC) to reduce corruption of the received data during assembly of the storage system or the host system the non-volatile memory device, and
wherein transitioning from the reflow-protection mode to the normal-operation mode comprises storing the received data in the normal-operation mode on the memory array as multi-level cells (MLC).

18. The method of claim 17, wherein transitioning from the reflow-protection mode to the normal-operation mode comprises storing the received data stored in the reflow-protection mode as SLC to the memory array as MLC.

19. The method of claim 14, comprising:
providing, using the host device, the threshold amount to the storage system; and
writing, using the host device, preloaded data to the storage system, wherein the preloaded data is smaller than the threshold amount.

20. The method of claim 14, wherein transitioning the storage system from the reflow-protection mode to the normal-operation mode comprises without receiving a separate verification of assembly or preloaded data.

* * * * *